United States Patent [19]

Miyata et al.

[11] Patent Number: 4,514,747
[45] Date of Patent: Apr. 30, 1985

[54] FIELD CONTROLLED THYRISTOR WITH DOUBLE-DIFFUSED SOURCE REGION

[75] Inventors: Kenji Miyata; Yoshio Terasawa, both of Katsuta; Saburo Oikawa, Hitachi; Susumu Murakami, Hitachi; Masahiro Okamura, Hitachi, all of Japan

[73] Assignee: Hitachi, Ltd., Tokyo, Japan

[21] Appl. No.: 357,594

[22] Filed: Mar. 12, 1982

Related U.S. Application Data

[63] Continuation-in-part of Ser. No. 63,476, Aug. 3, 1979, abandoned.

[30] Foreign Application Priority Data

Aug. 7, 1978 [JP] Japan ................................. 53-95474

[51] Int. Cl.³ ........................................... H01L 29/74
[52] U.S. Cl. ...................................... 357/38; 357/20; 357/22; 357/86; 357/90
[58] Field of Search .................. 357/22, 38, 86, 20, 357/90

[56] References Cited

U.S. PATENT DOCUMENTS

| 4,051,517 | 8/1977 | Fuse et al. | 357/22 |
| 4,060,821 | 11/1977 | Houston et al. | 357/22 |
| 4,132,996 | 1/1979 | Baliga | 357/22 |
| 4,198,648 | 4/1980 | Nishizawa | 357/22 |
| 4,223,328 | 9/1980 | Terasawa et al. | 357/38 |

FOREIGN PATENT DOCUMENTS 52-29180 3/1977 Japan ..................................... 357/22

Primary Examiner—Joseph E. Clawson, Jr.
Attorney, Agent, or Firm—Antonelli, Terry & Wands

[57] ABSTRACT

Disclosed is a field controlled thyristor in which a first semiconductor region of N+-type, a second semiconductor region of N-type, third semiconductor regions of P-type, a fourth semiconductor region of N⁻-type and a fifth semiconductor region of P+-type are formed in a semiconductor substrate having two main surfaces, the first, second and third semiconductor regions being exposed in the first main surface and the fifth semiconductor region being exposed in the second main surface; and the third semiconductor regions of P-type are spaced from each other by a predetermined spacing. The third semiconductor regions are connected with surface-exposed semiconductor regions exposed in the first main surface. The impurity concentration in the second semiconductor region decreases from the first semiconductor region toward the third semiconductor region so that a low forward voltage drop can be achieved along with a high reverse blocking voltage. Also disclosed is a method for forming the third semiconductor regions and the surface-exposed semiconductor regions through a diffusion process alone.

12 Claims, 8 Drawing Figures

FIELD CONTROLLED THYRISTOR WITH DOUBLE-DIFFUSED SOURCE REGION

CROSS REFERENCE TO RELATED APPLICATIONS

This is a continuation-in-part application of application, Ser. No. 63,476 filed on Aug. 3, 1979, now abandoned entitled FIELD CONTROLLED THYRISTOR AND METHOD FOR PRODUCING THE SAME.

BACKGROUND OF THE INVENTION

This invention relates to an improvement on a field controlled thyristor and a method for producing the same. One type of field controlled thyristor which is well known to those skilled in the art is a current controlling device in which an anode region and a cathode region are formed in and exposed to the two opposed main surfaces of a semiconductor substrate having one conductivity type, and a buried gate region is provided in the substrate to surround a current path from the anode to the cathode region. When such a field controlled thyristor is supplied with a reverse bias voltage, with its gate region and cathode region kept negative and positive, respectively, a space charge or depletion region extends around the gate region into the current path region so that the current path from the anode to the cathode region is electrically interrupted by the depletion region to cut off the anode-to-cathode current. For embedding the gate region, epitaxial growth after the formation of the gate region has been employed.

U.S. Pat. No. 4,060,821 issued to Houston et al, on Nov. 29, 1977, discloses a field controlled thyristor wherein the semiconductor substrate has two opposed main surfaces and a cathode region of $N^+$-type conductivity with its surface exposed in one of the main surfaces of the substrate, a gate contact region of $P^+$-type conductivity, a burried gate or grid region of P-type conductivity, a current path or channel region of $N^-$-type conductivity and an anode region of $P^+$-type conductivity with its surface exposed in the other main surface of the substrate are repeatedly formed in the lateral direction in the semiconductor substrate, with the adjacent buried grid regions of P-type conductivity spaced from each other by a predetermined distance.

The buried grid region is in contact with the gate contact region which is a surface-exposed region. A cathode electrode and a gate electrode are attached respectively on the cathode and the gate contact regions while an anode electrode is provided on the anode region. When a suitable reverse bias voltage is applied between the cathode and the gate electrodes, a space charge region expands through and occupies the spacing between the adjacent buried grid regions to interrupt the current flowing from the anode to the cathode. In this field controlled thyristor disclosed in the above U.S. Patent, the forward blocking voltage gain is increased by decreasing the spacing between the adjacent buried grid regions.

In the above field controlled thyristor, the forward voltage drop can be reduced by making the impurity concentration in a first portion of the channel region intervening between the cathode and the buried grid region higher than that in a second portion of the channel region intervening between the buried grid and the anode region, as has been suggested by Terasawa et al in the U.S. Pat. No. 4,223,328 filed on June 1, 1978 and issued on Sept. 16, 1980. The high impurity concentration in the first intervening portion of the channel region will improve the injection efficiency of the carriers being injected from the cathode region into the first and the second intervening portion of the channel region, thereby reducing the forward voltage drop.

On the other hand, since in this field controlled thyristor the P-N junction between the first intervening portion and the buried grid region is inversely biased, the P-N junction must usually have an inverse blocking voltage of higher than 50 V. Although the forward voltage drop decreases with the increase in the impurity concentration in the first intervening portion, the inverse blocking voltage of the P-N junction between the first intervening portion and the buried grid region is also lowered with the increase in the impurity concentration of the first intervening portion. In the field controlled thyristor disclosed in the above U.S. Pat. No. 4,223,328, there is thus a limitation, in view of the inverse blocking voltage, for increasing the impurity concentration in the first intervening portion of the channel region to provide a sufficiently low forward voltage drop. Also, in the field controlled thyristor described in the U.S. Pat. No. 4,223,328, the buried grid region lies between the first and the second intervening portions of the channel region which is of higher resistivity than the buried grid region, and is in contact with the gate contact region of $P^+$-type exposed in the first main surface of the semiconductor substrate. These gate contact and buried grid regions are formed through the combined use of diffusion process and epitaxial growth. As is well known, the epitaxial growth technique is a more complicated and delicate process than the diffusion process, thereby resulting in poor production yield and, therefore, high production cost. Accordingly, such a field controlled thyristor having a buried gate and produced by the combination of diffusion and epitaxial growth is necessarily an expensive one.

SUMMARY OF THE INVENTION

The main object of this invention is to provide a field controlled thyristor having a low forward voltage drop.

Another object of this invention is to provide a field controlled thyristor having a short turn-off time and a low forward voltage drop.

Yet another object of this invention is to provide a method for producing a simple field controlled thyristor at a low cost.

According to one feature of this invention, the impurity concentration in a region intervening between a heavily doped cathode region and a buried gate region decreases from the cathode to the gate region. This region has a relatively high net impurity concentration near the cathode region to enhance the carrier injection efficiency and yet has a relatively low net impurity concentration near the P-N junction with the buried gate region to enhance the breakdown voltage of the P-N junction. The gradient of the impurity concentration is preferably chosen to be in a range of $10^{19}$–$10^{23}$ (atoms/cm$^3$)/cm.

According to another feature of this invention, the gate region and the region intervening the cathode and the buried gate are formed by the diffusion process alone, without using epitaxial growth, so that the field controlled thyristor can be completed by the diffusion process alone.

DESCRIPTION OF THE PREFERRED EMBODIMENT

Figure 1:
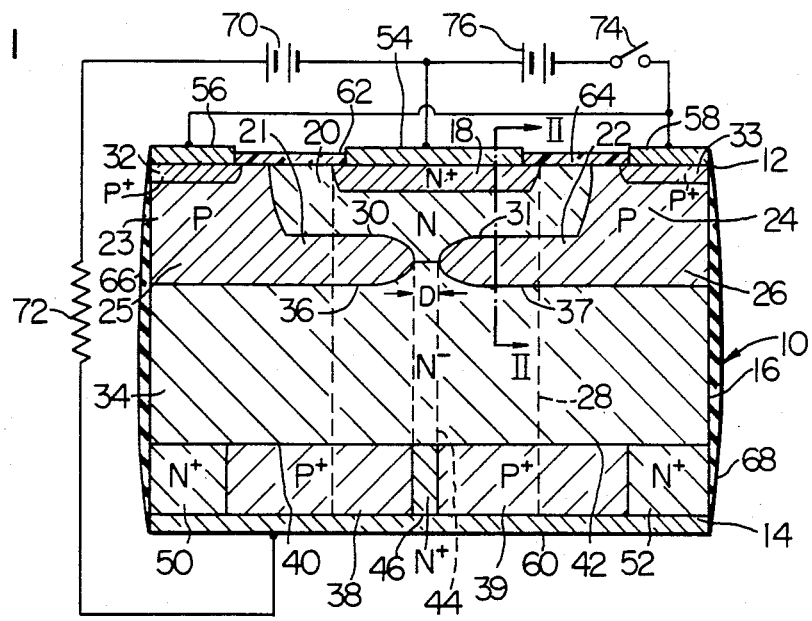
FIG. 1 shows in longitudinal cross section a field controlled thyristor as one embodiment of this invention.

In FIG. 1 showing a field controlled thyristor as an embodiment of this invention, a semiconductor 10 has a first (upper) and a second (lower) main surface 12 and 14, and a side surface 16 connecting these main surfaces. A first semiconductor region 18 of N+-type conductivity having a high impurity concentration is formed in the substrate 10, with its upper surface exposed in the first main surface 12. Adjacent to the first semiconductor region is formed a second semiconductor region 20 of N-type conductivity having an impurity concentration lower than that of the first region 18. The second semiconductor region 20, with part of its upper surface exposed in the first main surface 12, surrounds the first region 18.

Third semiconductor regions 21 and 22 of P-type conductivity adjacent to the second region and surface-exposed semiconductor regions 23 and 24 adjacent to the second region 20 and exposed in the first main surface 12, are continuous in the substrate 10 and form gate regions 25 and 26 which may also be continuous. The third semiconductor regions 21 and 22 extend laterally beneath the second region 20 toward each other, with their ends disposed opposite to each other and spaced from each other by a distance D in the substrate, shown at about the center of FIG. 1. The main current of this field controlled thyristor begins to flow through the spacing having the distance D. The spacing is located within the projection of the first region upon the second main surface 14. The third regions 21 and 22 form first P-N junctions 30 and 31 with the adjacent second region 20. In the exposed surfaces of the surface-exposed semiconductor regions 23 and 24 are formed P+-type regions 32 and 33 for serving as gate electrodes, with their upper surfaces exposed.

A fourth semiconductor region 34 of N−-type conductivity having an impurity concentration lower than that of the second region 20 is disposed adjacent to the third regions 21 and 22. The fourth semiconductor region 34 forms second P-N junctions 36 and 37 with the third regions 21 and 22. Fifth semiconductor regions 38 and 39 of P+-type conductivity are formed adjacent to the fourth semiconductor region 34 to form third P-N junctions 40 and 42, with their lower surfaces exposed in the second main surface 14. A short-circuiting semiconductor region 46 of N+-type is formed, exposed in the second main surface 14, corresponding to the projection of the spacing D between the third regions 21 and 22 upon the second main surface 14. The semiconductor region 46 is contiguous with the fourth region 34 at the deepest end thereof. Semiconductor regions 50 and 52 of N+-type are also formed adjacent to the outer periphery of the fifth semiconductor regions 38 and 39.

A cathode electrode 54 is provided on the surface of the first region 18 exposed in the first main surface 12 of the substrate 10, in ohmic contact with the surface. Gate electrodes 56 and 58 are disposed in ohmic contact with the exposed surfaces of the P+-type regions 32 and 33 formed in the surface-exposed regions 23 and 24. An anode electrode 60 is disposed in ohmic contact with the surfaces of the fifth regions 38 and 39 and the N+-type regions 46, 50 and 52 exposed in the second main surface 14.

The first main surface 12 is covered with silicon dioxide film 62 and 64 and the side surface 16 is coated with layers 66 and 68 of insulating material such as silicon rubber. A series-connected circuit of a dc power source 70 and a load 72 is connected between the anode electrode 60 and the cathode electrode 54 while a series circuit of a switch 74 and a bias voltage source 76 is connected between the cathode electrode 54 and the gate electrode 56 and 58.

Figure 2:
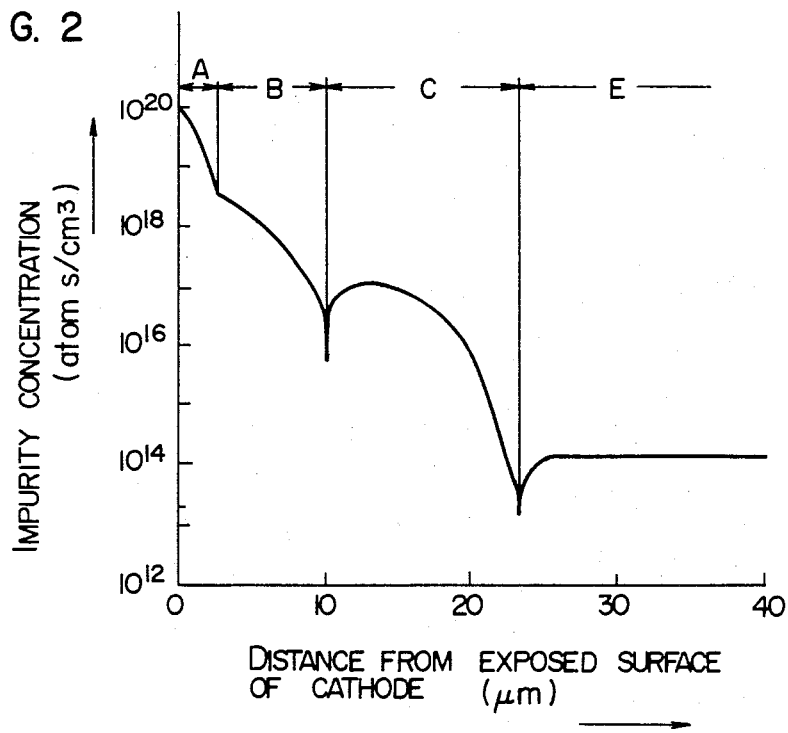
FIG. 2 shows an impurity concentration distribution in the thyristor of FIG. 1 along the line II—II.

In FIG. 2 showing an example of the impurity concentration distribution in the field controlled thyristor of FIG. 1 along the line II—II, the impurity concentration in the second region 20 is about $2 \times 10^{18}$ atoms/cm$^3$ in the area thereof where it overlaps the first region 18, and about $5 \times 10^{16}$ atoms/cm$^3$ in the neighborhood of the area thereof where it overlaps the third regions 21 and 22, the impurity concentration decreasing from the first region 18 toward the third regions 21 and 22. The gradient of the impurity concentration in this example is chosen to be in a range of $3 \times 10^{19}$ (atoms/cm$^3$)/cm to $1.4 \times 10^{21}$ (atoms/cm$^3$)/cm. In FIG. 2, the intervals A, B, C and E correspond respectively to the thicknesses of the first region 18, the second region 20, the third regions 21, 22 and the fourth region 34.

With the field controlled thyristor shown in FIG. 1, when the voltage from the source 70 is applied between the anode and the cathode electrode 60 and 54, with the switch 74 open, current starts flowing through the spacing D. This current flows mainly through a low-resistance domain consisting of the first region 18 of N+-type, the second region 20 of N-type, the fourth region 34 of N−-type and the N+-type region 46. The carriers injected into the low-resistance domain diffuse into the adjacent regions. Accordingly, current starts flowing through the thyristor region constituted of the first region 18, the second region 20, the third regions 21 and 22, the fourth region 34 and the fifth region 38 so that the field controlled thyristor is turned on. When the switch 74 is closed, space-charge layers expand around the third regions 21 and 22 to interrupt the current flowing through the spacing D. The above operation of the FCT is described in detail in the above cited U.S. Pat. No. 4,223,328.

In the case where the impurity concentration in the second region 20 has a gradient decreasing from the first region 18 toward the third regions 21 and 22, the carrier injection efficiency can be improved without lowering the inverse blocking voltage, because this gradient of the impurity concentration gives an increase of the electron diffusion current and the impurity concentration in the second region 20 is lowest near the P-N junctions 30 and 31, as shown in FIG. 2, and therefore the inverse blocking voltages associated with the P-N junctions 30 and 31 can be kept high.

Further, the gradient of the impurity concentration in the second region 20 shortens the turn-off time of the field controlled thyristor. When the bias voltage from the power source 76 is applied between the gate electrodes 56 and 58 and the cathode electrode 54, with the switch 74 closed and with the gate electrode and the cathode electrode kept respectively at a negative and a positive potential, to turn off the field controlled thyristor, the positive holes near the first P-N junction 30 and 31 flow through the gate electrode 58. Simultaneously, the positive holes in the second (and the fourth) region 20 (and 34) flow into the third regions 21 and 22. Similarly, electrons near the P-N junction 30 and 31 are attracted toward the cathode region 18. Thus a space-charge layer is formed on both the sides of each of the third regions 21 and 22. If in this case the annihilation of the carriers in the vicinity of the first and the second P-N junctions 30 and 31, and 36 and 37 is fast, the turn-off time becomes short.

Since in this embodiment the impurity concentration in the second region 20 increases with the distance from the first P-N junctions 30 and 31, the life-time of the carriers becomes shorter with the increase of this distance. Accordingly, the carriers existing far from the first P-N junctions 30 and 31 swiftly annihilate through recombination so that space-charge layers are swiftly formed around the third regions 21 and 22 to turn off the field controlled thyristor quickly.

When the anode-cathode voltage was 1000 V and the gate bias voltage was −10 V, the forward voltage drop and the turn-off time of the diffused thyristor embodying this invention was about 1.1 V and 3 μsec while under the same condition those of the epitaxial field controlled thyristor according to the above cited U.S. Pat. No. 4,223,328 were 1.2 V and 5 μsec. This means that according to this invention the forward voltage drop can be lowered and at the same time the turn-off time can be shortened.

Although the spacing D defined between the third regions 21 and 22 is located in the center of the area of projection of the first region 18 upon the second main surface 14, as shown in FIG. 1, it may also be laterally shifted.

Figure 3A:
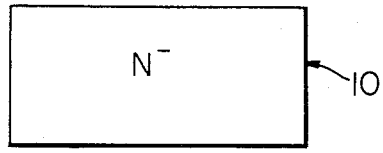
FIGS. 3A to 3F show in cross section the steps of a manufacturing process as an embodiment of this invention.
Figure 3B:
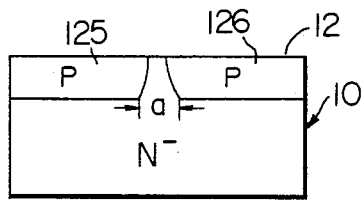

Next, the steps of a process for producing a field controlled thyristor as shown in FIG. 1 will be described with the aid of FIGS. 3A to 3F. First, as shown in FIG. 3A, a silicon substrate 10 of $N^-$-type having a high resisitivity of 50 ohm-cm and a thickness of 200 μm is prepared. Then, as shown in FIG. 3B, boron atoms are diffused down to a depth of about 15 μm into the first main surface 12 of the silicon substrate 10, to form gate diffusion regions 125 and 126 of P-type conductivity spaced from each other by a distance a of about 17 μm. The diffusion of boron is performed according to the well-known predeposition-drivein method, with the silicon dioxide film (not shown) used as a mask. The surface impurity concentration of boron is set at about $10^{17}$ atoms/cm$^3$.

Figure 3C:
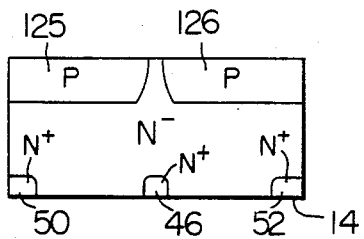

As shown in FIG. 3C, after the formation of the gate diffusion regions 125 and 126, phosphorus atoms are diffused into the second main surface 14 of the silicon substrate 10 up to a depth of about 3 μm, to partially form diffusion regions 46, 50 and 52 of $N^+$-type conductivity in the second main surface 14.

Figure 3D:
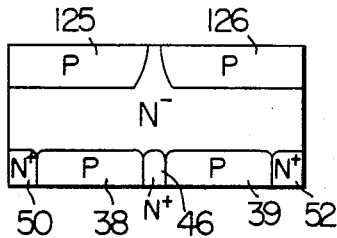

Boron atoms are again diffused selectively into the second main surface 14 up to a depth equal to that of the diffused regions 46, 50 and 52, with the surface of the diffusion regions 46, 50 and 52 covered with a mask of silicon dioxide film. As a result of this selective diffusion, anode diffusion regions 38 and 39 are formed alternate with the shorting diffusion regions 50, 46 and 52, as shown in FIG. 3D.

Figure 3E:
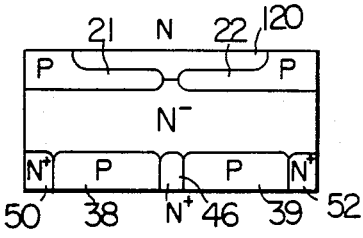

After the anode diffusion regions 38 and 39 have been formed, phosphorus atoms are diffused at a low concentration into that region of the first main surface 12 which includes the gate diffusion regions 125 and 126 and the intervening region therebetween, up to a depth smaller than that of the gate diffusion regions 125 and 126, e.g. 5 μm. The surface impurity concentration of phosphorus atoms is of the order of $10^{17}$ to $10^{19}$ atoms/cm$^3$, e.g. about $5 \times 10^{18}$ atoms/cm$^3$ as in FIG. 2. As a result of this, portions of the gate diffusion regions 125 and 126 having a P-type conductivity are inverted into an N-type region which serves as a cathode side diffusion region of N-type conductivity and embeds the gate regions 21 and 22, as shown in FIG. 3E. Consequently, buried P-type regions 21 and 22 are finished defining an N-type channel therebetween within the silicon substrate 10. In the diffusion region 120, the impurity concentration becomes lower with the distance from the main surface 12 into the silicon substrate 10.

Figure 3F:
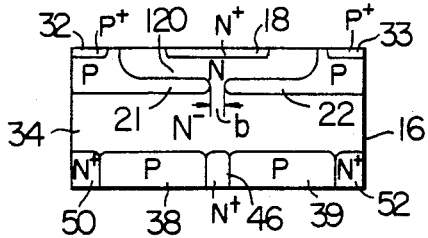

As shown in FIG. 3F, phosphorus atoms are diffused up to a depth of about 3 μm into the exposed surface of the diffusion region 120, to form a cathode diffusion region 18 heavily doped with phosphorus while boron atoms are diffused at a high concentration up to a depth of about 3 μm into the exposed surfaces of the gate diffusion regions 125 and 126, to form gate contact diffusion regions 32 and 33 heavily doped with boron. The initial spacing a between the gate diffusion regions 125 and 126 which is about 17 μm in FIG. 3B, is narrowed to a final spacing b of about 5 μm after the completion of all the diffusion steps (FIG. 3F) since auxiliary diffusion of boron takes place in the diffusion steps after the initial boron diffusion step. In like manner, as a result of such auxiliary diffusion, the final depths of the gate diffusion regions 125 and 126; the cathode side diffusion region 120; the shorting diffusion regions 46, 50 and 52; and the anode diffusion regions 38 and 39 are 23 μm, 10 μm, 15 μm, and 15 μm, respectively. Then, as shown in FIG. 1, the side surface 16 of the semiconductor substrate 10 is covered with layers 66 and 68 of silicone rubber. The silicon dioxide film 64 formed on the first main surface 12 serves as an insulating film.

Finally, a cathode electrode 54 is formed on the cathode diffusion region 18 heavily doped with phosphorus; gate electrodes 56 and 58 are formed on the gate contact diffusion regions 32 and 33 heavily doped with boron; and an anode electrode 60 is formed on the shorting diffusion regions 46, 50 and 52 and the anode diffusion regions 38 and 39, whereby such a field controlled thyristor as shown in FIG. 1 is finished.

As described above, according to this invention, a field controlled thyristor can be produced by the use of a diffusion process alone so that the fabrication of the thyristor can be facilitated and the cost of the product can be low.

We claim:
1. A field controlled thrystor comprising:
   (a) a semiconductor substrate having a first and a second main surface opposed to each other, said semiconductor substrate including
      (a1) a first semiconductor region of one conductivity type exposed in a portion of said first main surface,
      (a2) a second semiconductor region of said one conductivity type adjacent to said first semiconductor region and having a lower impurity concentration than said first region,
      (a3) gate regions of the other conductivity type adjacent to said second region and forming first P-N junctions with said second region, each of said gate regions including a surface-exposed region exposed in said first main surface and a third semiconductor region laterally extending and connected with said surface-exposed region, and said third region being spaced from the adjacent third region by a spacing D which is located in the area of projection of said first region upon said second main surface, (a4) a fourth semiconductor region of said one conductivity type adjacent to said third regions and having a lower impurity concentration than said second region, said fourth region forming second P-N junctions with said third regions, and (a5) fifth semiconductor regions of said other conductivity type adjacent to said fourth region and exposed in said second main surface, said fifth region forming third P-N junctions with said fourth region, wherein the impurity concentration in said second region has a gradient of decrease from said first region toward said third regions so that the impurity concentration in said second region adjacent to said first region is greater than the impurity concentration in said second region adjacent to said third region and and so that the impurity concentration continuously decreases in the second region from the point of adjacency with the first region to the point of adjacency with the third regions, said third semiconductor region being a diffused region in said fourth semiconductor region diffused from said first main surface, said second semiconductor region being a diffused region in said gate regions and fourth semiconductor region diffused from said first main surface to invert a portion of said gate regions to form said second semiconductor region and to bury said third semiconductor region, said first semiconductor region being a diffused region in said second semiconductor region diffused from said first main surface and said third semiconductor region being sandwiched between said second and fourth semiconductor regions;

(b) a cathode electrode kept in ohmic contact with said first region exposed in said first main surface;

(c) an anode electrode kept in ohmic contact with said fifth regions exposed in said second main surface; and (d) gate electrodes kept in ohmic contact with said surface-exposed regions exposed in said first main surface, wherein said decreasing net impurity concentration in said second region is set so that said second region will have a low impurity concentration at a portion thereof in contact with said buried third semiconductor region of said gate regions to provide a high reverse blocking voltage for said field controlled thyristor and so that said second region will have a high impurity concentration at a portion thereof in contact with said first semiconductor region to provide a low forward voltage drop for said field controlled thyristor.

2. A field controlled thyristor as claimed in claim 1, wherein the lateral cross-sectional area of said second region decreases from said first region toward said third regions.

3. A field controlled thyristor as claimed in claim 1, wherein the gradient of said impurity concentration in said second region is within a range of $1 \times 10^{19} \sim 1 \times 10^{23}$(atoms/cm$^3$)/cm.

4. A field controlled thyristor as claimed in claim 1, wherein a sixth semiconductor region of said one conductivity type having a higher impurity concentration than said second region and connecting said fourth region with said second main surface is formed in the area of projection of said spacing D between said third regions upon said second main surface.

5. A field controlled thyristor as claimed in claim 1, wherein said first, second, third, fourth and fifth semiconductor regions are formed by diffusing in said semiconductor substrate.

6. A field controlled thyristor as claimed in claim 1, wherein the lateral cross-sectional area of said surface-exposed region decreases toward said first main surface.

7. A field controlled thyristor formed in a semiconductor substrate having a low impurity concentration of a first conductivity type and a first and a second principal surface, comprising:

a gate region of a second conductivity type opposite to said first conductivity type, formed by diffusion from said first principal surface, the gate region including portions spaced by a predetermined gap to leave part of said semiconductor substrate;

a diffused region of said first conductivity type, formed by diffusion from said first principal surface to partially invert said gate region to said first conductivity type, leaving said spaced portions of the gate region embedded in the substrate, the diffused region being contiguous to said part of the substrate left in said gap, wherein said diffused region has a decreasing net impurity concentration from the first principal surface to the embedded spaced portions of the gate region and forms P-N junctions with said embedded spaced portions;

a current and a control electrode electrically connected to said diffused region and said gate region, respectively, the both electrodes being disposed on said first principal surface, and a first heavily doped region of said first conductivity type formed in said diffused region and having a higher impurity concentration than that of the diffused region, the first heavily doped region having a width larger than that of said predetermined gap disposed at a location above the gap between said diffused region and said current electrode, wherein said decreasing net impurity concentration in said diffused region is set so that said diffused region will have a low impurity concentration at a portion thereof in contact with said embedded spaced portions of the gate region to provide a high reverse blocking voltage for said field controlled thyristor and so that said diffused region will have a high impurity concentration at a portion thereof in contact with said first heavily doped region to provide a low forward voltage drop for said field controlled thyristor.

8. A field controlled thyristor according to claim 7, further comprising:

a second heavily doped region of said second conductivity type formed in said substrate adjacent to said second principal surface; and a third heavily doped region of said first conductivity type formed in said substrate adjacent to said second principal surface and juxtaposed with said second heavily doped region.

9. A field controlled thyristor according to claim 7, further comprising:
a fourth heavily doped region of said second conductivity type formed in said gate region adjacent to the first principal surface and disposed between said gate region and said control electrode.

10. A field controlled thyristor according to claim 1, wherein said third region has a substantial area which overlaps a substantial peripheral area of said first region, when projected perpendicular to said main surfaces, to constitute a pnpn type thyristor structure.

11. A field controlled thyristor according to claim 7, further comprising a region of said second conductivity type formed in the substrate adjacent to said second principal surface, wherein said gate region includes a laterally extending embedded portion below the first heavily doped region so that a substantial peripheral area of the first heavily doped region overlaps the extending embedded portion, thereby to constitute a pnpn type thyristor structure.

12. A field controlled thyristor according to claim 7, wherein the gradient of said impurity concentration in said diffused region is within a range of $1 \times 10^{19}$ to $1 \times 10^{23}$ (atoms/cm$^3$)/cm.

* * * * *